United States Patent
Nurmikko et al.

(10) Patent No.: US 9,373,931 B2
(45) Date of Patent: Jun. 21, 2016

(54) RED, GREEN, AND BLUE LASING ENABLED BY SINGLE-EXCITON GAIN IN COLLOIDAL QUANTUM DOT FILMS

(71) Applicant: Brown University, Providence, RI (US)

(72) Inventors: Arto V. Nurmikko, Providence, RI (US); Cuong Dang, Providence, RI (US)

(73) Assignee: BROWN UNIVERSITY, Providence, RI (US)

( * ) Notice: Subject to any disclaimer, the term of this patent is extended or adjusted under 35 U.S.C. 154(b) by 0 days.

(21) Appl. No.: 14/391,557

(22) PCT Filed: Apr. 11, 2013

(86) PCT No.: PCT/US2013/036260
§ 371 (c)(1),
(2) Date: Oct. 9, 2014

(87) PCT Pub. No.: WO2014/014529
PCT Pub. Date: Jan. 23, 2014

(65) Prior Publication Data
US 2015/0076408 A1    Mar. 19, 2015

Related U.S. Application Data

(60) Provisional application No. 61/622,666, filed on Apr. 11, 2012.

(51) Int. Cl.
*H01S 5/00*   (2006.01)
*H01S 3/16*   (2006.01)
*H01S 5/10*   (2006.01)
(Continued)

(52) U.S. Cl.
CPC .............. *H01S 3/169* (2013.01); *H01S 5/1067* (2013.01); *H01S 5/347* (2013.01); *H01S 3/0627* (2013.01); *H01S 3/094038* (2013.01); *H01S 5/183* (2013.01)

(58) Field of Classification Search
CPC ....... H01S 5/1067; H01S 5/183; H01S 5/347; H01S 3/169
USPC .................. 372/50.124, 50.1, 43.01
See application file for complete search history.

(56) References Cited

U.S. PATENT DOCUMENTS 7,935,419 B1 *   5/2011   Hollingsworth ....... B82Y 10/00
                                                      428/402
8,891,575 B2 *   11/2014  Snee .................... B82Y 20/00
                                                      372/102
(Continued)

OTHER PUBLICATIONS

Achermann, M. et al., "Multiexcitons Confined Within a Subexcitonic Volume: Spectroscopic and Dynamical Signatures of Neutral and Charged Biexcitons in Ultrasmall Semiconductor Nanocrystals," Phys. Rev. B, vol. 68, pp. 245302-1-245302-5 (2003).

(Continued)

*Primary Examiner* — Kinam Park
(74) *Attorney, Agent, or Firm* — Wilmer Cutler, Pickering Hale and Dorr LLP

(57) ABSTRACT

The methods and materials described herein contemplate the use films of colloidal quantum dots as a gain medium in a vertical-cavity surface-emitting laser. The present disclosure demonstrates a laser with single-exciton gain in the red, green, and blue wavelengths. Leveraging this nanocomposite gain, the results realize a significant step toward full-color single-material lasers.

13 Claims, 13 Drawing Sheets

(51) Int. Cl.
  H01S 5/347   (2006.01)
  H01S 5/183   (2006.01)
  H01S 3/06    (2006.01)
  H01S 3/094   (2006.01)

(56) References Cited

U.S. PATENT DOCUMENTS

| | | | |
|---|---|---|---|
| 2003/0066998 A1* | 4/2003 | Lee | B82Y 10/00 257/19 |
| 2010/0097691 A1* | 4/2010 | Memon | C09K 11/02 359/346 |
| 2010/0279394 A1* | 11/2010 | Bocking | B81C 3/002 435/287.1 |
| 2010/0309460 A1* | 12/2010 | Sargent | H01L 31/035218 356/218 |
| 2011/0006285 A1* | 1/2011 | Lifshitz | C09K 11/025 257/15 |
| 2011/0059467 A1* | 3/2011 | Ting | G01N 33/588 435/7.21 |
| 2011/0129420 A1 | 6/2011 | Allen et al. | |
| 2011/0133100 A1* | 6/2011 | Kambhampati | B82Y 20/00 250/459.1 |

OTHER PUBLICATIONS

Agrawal, Govind P., "Semiconductor Lasers : Past, Present, and Future," Woodbury, NY: American Institute of Physics, 6 pages (Title Page, Copyright and Table of Contents only) (1995).
Amirav, L. and Alivisatos, A. P., "Photocatalytic Hydrogen Production with Tunable Nanorod Heterostructures," The Journal of Physical Chemistry Letters, vol. 1, No. 7, pp. 1051-1054 (2010).
Arakawa, Y. and Sakaki, H., "Multidimensional Quantum Well Laser and Temperature Dependence of its Threshold Current," Applied Physics Letters, vol. 40, No. 11, pp. 939-941 (Jun. 1, 1982).
Asada, M. et al., "Gain and the threshold of three-dimensional quantum-box lasers," IEEE Journal of Quantum Electronics, vol. 22, No. 9, pp. 1915-1921 (1986).
Bailey, R. E. et al., "Quantum dots in biology and medicine," Physica E: Low-dimensional Systems and Nanostructures, vol. 25, No. 1, pp. 1-12 (2004).
Brus, L. E., "Electron—electron and electron-hole interactions in small semiconductor crystallites: The size dependence of the lowest excited electronic state," The Journal of Chemical Physics, vol. 80, No. 9, pp. 4403-4409 (May 1, 1984).
Caruge, J.-M. et al., "Transient Photoluminescence and Simultaneous Amplified Spontaneous Emission from Multiexciton States in Cdse Quantum Dots," Physical Review B, vol. 70, pp. 085316-1-085316-7(2004).
Chan, Y. et al., "Multiexcitonic two-state lasing in a CdSe nanocrystal laser," Applied Physics Letters, vol. 85, No. 13, pp. 2460-2462 (Sep. 27, 2004).
Cho, K.-S. et al., "High-performance Crosslinked Colloidal Quantum-dot Light-emitting Diodes," Nature Photonics, vol. 3, No. 6 pp. 341-345 (Jun. 2009).
Coe, S. et al., "Electroluminescence From Single Monolayers of Nanocrystals in Molecular Organic Devices," Nature, vol. 420, No. 6917, pp. 800-803 (Dec. 2002).
Coe-Sullivan, S. et al., "Large-Area Ordered Quantum-Dot Monolayers via Phase Separation During Spin-Casting," Advanced Functional Materials, vol. 15, No. 7, pp. 1117-1124 (2005).
Cooney, R. R. et al., "Gain Control in Semiconductor Quantum Dots via State-Resolved Optical Pumping," Physical Review Letters, vol. 102, No. 12, pp. 127404-1-127404-4 (2009).
Cooney, R. R. et al., "State-Resolved Manipulations of Optical Gain in Semiconductor Quantum Dots: Size Universality, Gain Tailoring, and Surface Effects," The Journal of Chemical Physics, vol. 131, No. 16, pp. 164706-1-164706-13 (2009).
Ding, J. et al., "(Zn,Cd)Se/ZnSe quantum-well Lasers: Excitonic Gain in an Inhomogeneously Broadened Quasi-two-dimensional System," Physical Review B, vol. 47, No. 16, pp. 10528-10542 (Apr. 15, 1993).
Ding, J. et al., "Excitonic Gain and Laser Emission in ZnSe-based Quantum Wells," Physical Review Letters, vol. 69, No. 11, pp. 1707-1710 (Sep. 14, 1992).
Dodabalapur, A. et al., "Resonators and Materials for Organic Lasers Based on Energy Transfer," IEEE Journal of Selected Topics in Quantum Electronics, vol. 4, No. 1, pp. 67-74 (Jan./Feb. 1998).
Efros, A. L. et al., "Breaking the Phonon Bottleneckin Nanometer Quantum Dots: Role of Auger-Like Processes," Solid State Communications, vol. 93, No. 4, pp. 281-284 (1995).
Fisher, B. et al., "Multiexciton fluorescence from semiconductor nanocrystals," Chemical Physics, vol. 318, No. 1-2, pp. 71-81 (2005).
Giessen, H. et al., "Quantum Dots in the Strong Confinement Regime: A Model System for Gainin Quasi Zero-Dimensional Semiconductors," Chemical Physics, vol. 210, No. 1-2, pp. 71-78 (1996).
Goede, O. et al., "Compositional Disorder-Induced Broadening for Free Excitons in II-VI Semiconducting Mixed Crystals," Physica Status Solid (b), vol. 89, No. 2, pp. K183-K186 (1978).
Htoon, H. et al., "Zero- to one-dimensional Transition and Auger Recombination in Semiconductor Quantum Rods," Phys. Rev. Lett., vol. 91, pp. 227401-1-227401-4 (2003).
Huang, H. et al., "Electrically Driven Light Emission From Single Colloidal Quantum Dots at Room Temperature," Applied Physics Letters, vol. 90, No. 2, pp. 023110-1-023110-3 (2007).
International Search Report and Written Opinion issued by the U.S. Patent and Trademark Office as the International Searching Authority for International Application No. PCT/US13/036260 mailed Jan. 14, 2014 (8 pgs.).
Kim, S. et al., "Type-II Quantum Dots: CdTe/CdSe(Core/Shell) and CdSe/ZnTe(Core/Shell) Heterostructures," J. Am. Chem. Soc., vol. 125, No. 38, pp. 11466-11467 (2003).
Kim, T.-H. et al., "Full-colour Quantum Dot Displays Fabricated by Transfer Printing," Nat Photon, vol. 5, No. 3, pp. 176-182 (Mar. 2011).
Klimov, V. I. et al., "Optical Gain and Stimulated Emission in Nanocrystal Quantum Dots," Science, vol. 290, No. 5490, pp. 314-317 (Oct. 13, 2000).
Klimov, V. I. et al., "Quantization of multiparticle Auger rates in semiconductor quantum dots," Science, vol. 287, pp. 1011-1013 (Feb. 11, 2000).
Klimov, V. I. et al., "Scaling of multiexciton lifetimes in semiconductor nanocrystals," Physical Review B, vol. 77, No. 19, pp. 195324-1-195324-12 (2008).
Klimov, V. I. et al., "Single-exciton Optical Gain in Semiconductor Nanocrystals," Nature, vol. 447, No. 7143, pp. 441-446 (May 24, 2007).
Kyhm, K. et al., "Gain Dynamics and Excitonic Transition in CdSe Colloidal Quantum Dots," Optical Materials, vol. 30, No. 1, pp. 158-160 (2007).
Lavchiev, V. M. et al., "A Quantum Dot Nanoimprinted DFB Laser," IOP Conference Series: Materials Science and Engineering, vol. 6, No. 1, 012028, pp. 1-5 (2009).
Malko, A. V. et al., "From Amplified Spontaneous Emission to Microring Lasing Using Nanocrystal Quantum Dot Solids," Applied Physics Letters, vol. 81, No. 7, pp. 1303-1305 (Aug. 12, 2002).
Medintz, I. L. et al., "Quantum Dot Bioconjugates for Imaging, Labelling and Sensing," Nature Materials, vol. 4, No. 6, pp. 435-446 (Jun. 2005).
Mikhailovsky, A. A. et al., "Multiparticle Interactions and Stimulated Emission in Chemically Synthesized Quantum Dots," Appl. Phys. Lett., vol. 80, No. 13, pp. 2380-2382 (Apr. 1, 2002).
Murray, C. B. et al., "Synthesis and characterization of nearly monodisperse CdE (E = S, Se, Te) semiconductor nanocrystallites," J. Am. Chem. Soc., vol. 115, pp. 8706-8715 (1993).
Norris, D. J. et al., "Measurement of the size-dependent hole spectrum in CdSe quantum dots," Phys. Rev. Lett., vol. 72, No. 16, pp. 2612-2615 (Apr. 18, 1994).
Nurmikko, A. V. and Gunshor, R. L., "Blue-Green Semiconductor Lasers," Solid State Communications, vol. 92, No. 1-2, pp. 113-118 (1994).
Peng, X. et al., "Kinetics of II-VI and III-V Colloidal Semiconductor Nanocrystal Growth: "Focusing" of Size Distributions," J. Am. Chem. Soc., vol. 120, No. 21, pp. 5343-5344 (1998).

(56) References Cited

OTHER PUBLICATIONS

Resch-Genger, U. et al., "Quantum dots versus organic dyes as fluorescent labels," Nature Methods, vol. 5, No. 9, pp. 763-775 (Sep. 2008).

Risk, W. P. et al., "Compact Blue-Green Lasers," The University of Cambridge, Cambridge University Press, 8 pages (Title page, Copyright and Table of Contents only) (2003).

Saba, M. et al., "Exciton-Exciton Interaction and Optical Gain in Colloidal CdSe/CdS Dot/Rod Nanocrystals," Advanced Materials, vol. 21, No. 48, pp. 4942-4946 (2009).

Singh, V.P. and Singh, S., "Some physical properties of ZnCdS solid solutions," Czechoslovak Journal of Physics, vol. 26, No. 10, pp. 1161-1166 (1976).

Sun, Q. et al., "Bright, Multicoloured Light-emitting Diodes Based on Quantum Dots," Nature Photonics, vol. 1, No. 12, pp. 717-722 (Dec. 2007).

Wang, L.-W. et al., "Pseudopotential Theory of Auger Processes in CdSe Quantum Dots," Physical Review Letters, vol. 91, No. 5, pp. 056404-1-056404-4 (Aug. 1, 2003).

Wood, V. et al., "Inkjet-Printed Quantum Dot-Polymer Composites for Full-Color AC-Driven Displays," Advanced Materials, vol. 21, No. 21, pp. 2151-2155 (2009).

Xie, R. et al., "Synthesis and Characterization of Highly Luminescent CdSe?Core CdS/Zn0.5Cd0.5S/ZnS Multishell Nanocrystals," J. Am. Chem. Soc., vol. 127, No. 20, pp. 7480-7488 (2005).

Zhao, J. et al., "Efficient CdSe/CdS Quantum Dot Light-Emitting Diodes Using a Thermally Polymerized Hole Transport Layer," Nano Letters, vol. 6, No. 3, pp. 463-467 (2006).

\* cited by examiner

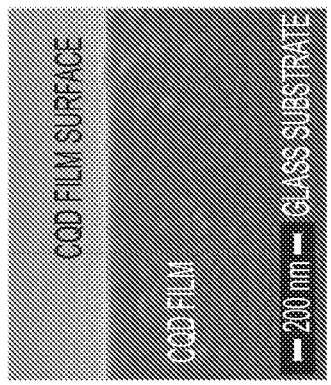
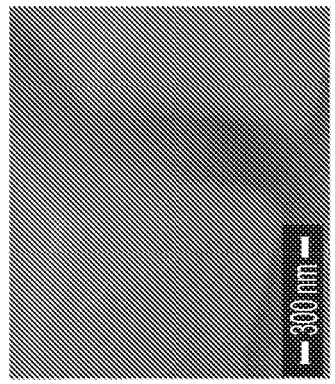
FIG. 1C
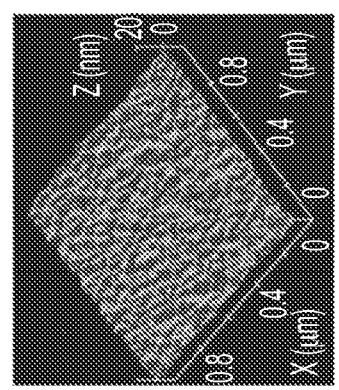
FIG. 1E
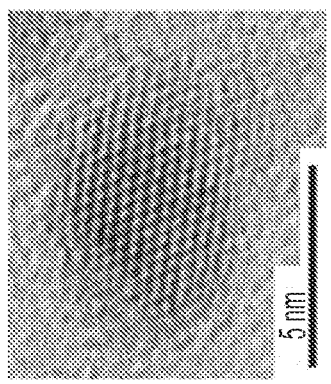
FIG. 1B
FIG. 1D
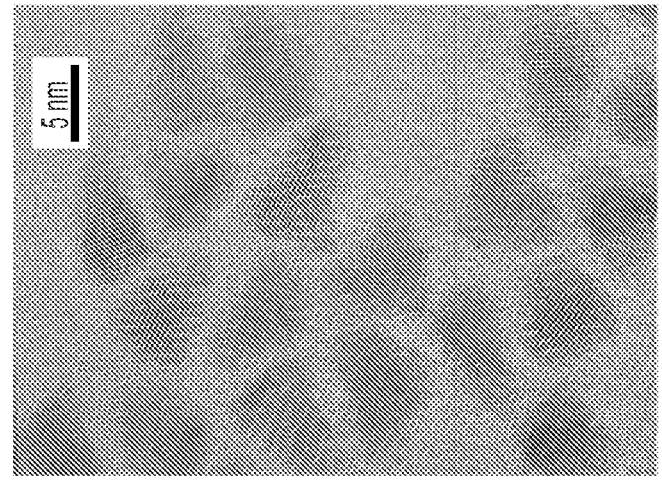
FIG. 1A

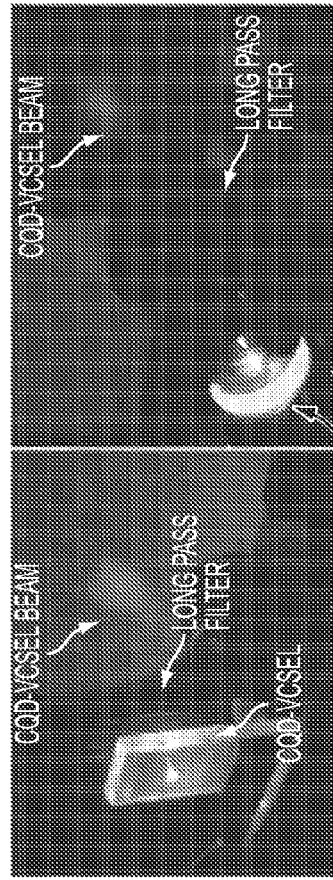
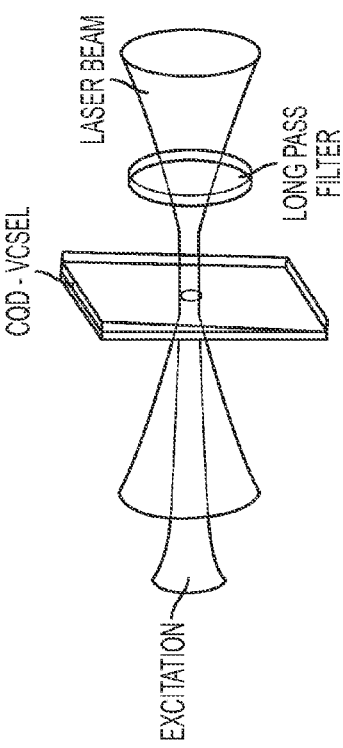
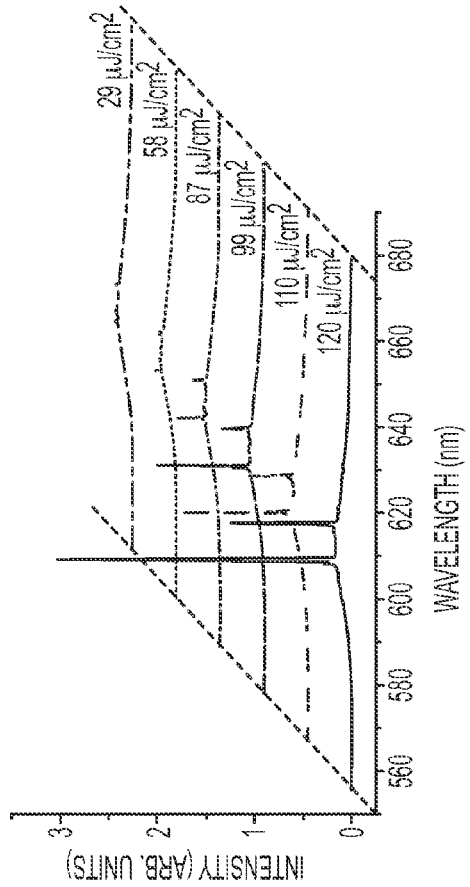
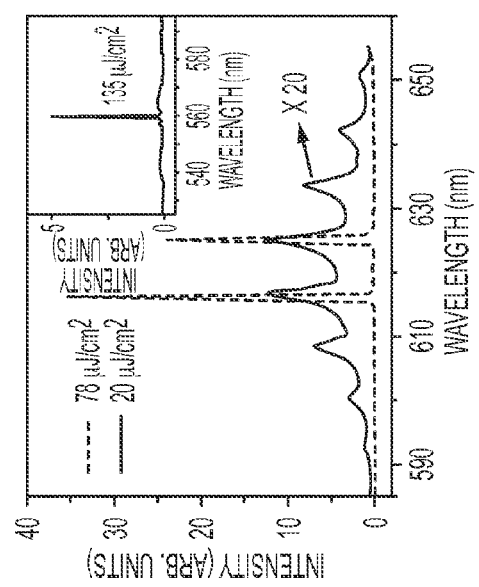
FIG. 4A
FIG. 4B
FIG. 4C
FIG. 4D
FIG. 4E

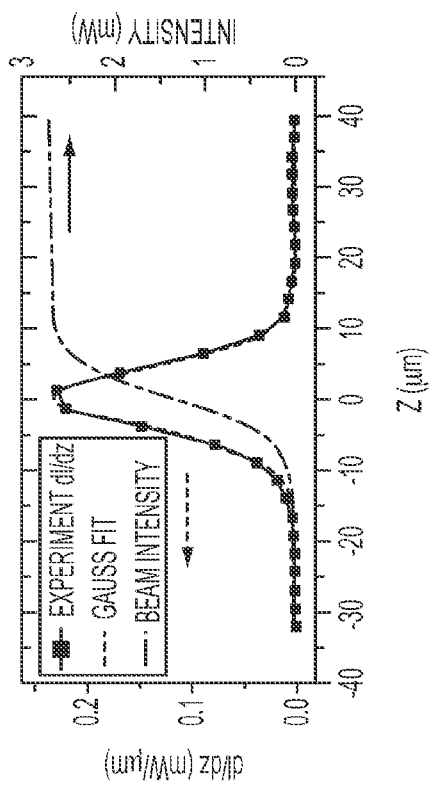
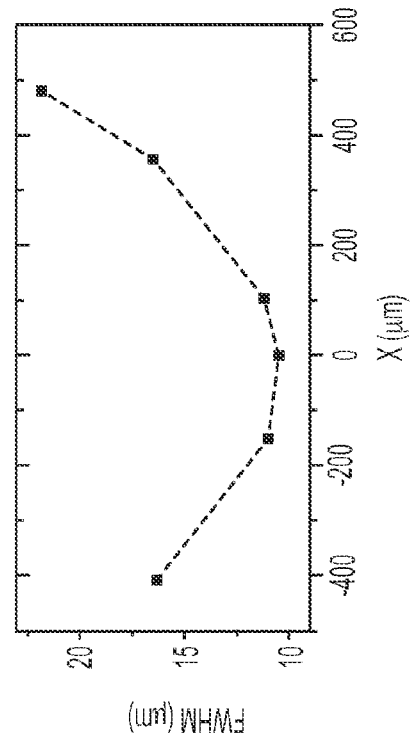
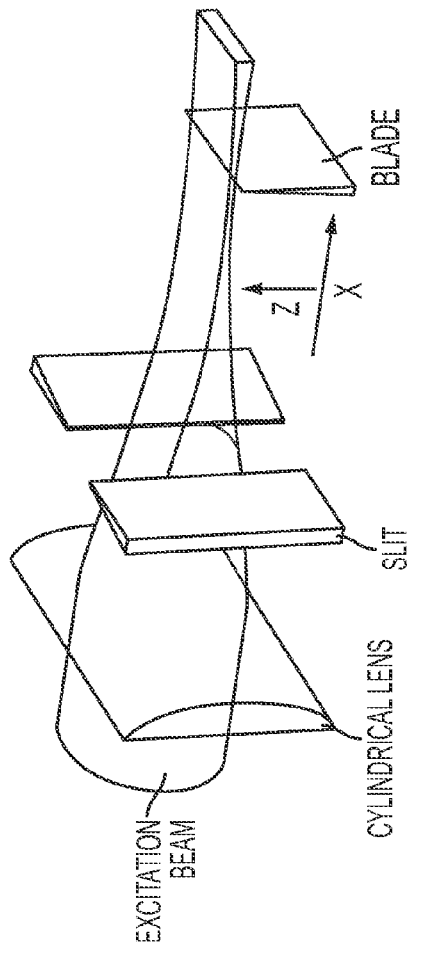
FIG. 8A
FIG. 8B
FIG. 8C

RED, GREEN, AND BLUE LASING ENABLED BY SINGLE-EXCITON GAIN IN COLLOIDAL QUANTUM DOT FILMS

CROSS-REFERENCE TO RELATED APPLICATIONS

This application is a National Stage Entry of PCT/US13/36260, filed Apr. 11, 2013, which claims priority to U.S. Provisional Application Ser. No. 61/622,666, filed Apr. 11, 2012, all of which are incorporated herein by reference.

STATEMENT REGARDING FEDERALLY SPONSORED RESEARCH OR DEVELOPMENT

This invention was made in part with government support under Grant No. DEFG02-07ER46387 awarded by Department of Energy/Basic Energy Sciences and Grant No. ECCS-1128331 awarded by National Science Foundation. The United States government has certain rights in this invention.

INCORPORATION BY REFERENCE

All patents, patent applications and publications cited herein are hereby incorporated by reference in their entirety in order to more fully describe the state of the art as known to those skilled therein as of the date of the invention described herein.

TECHNICAL FIELD

This technology relates generally to lasers. In particular, this technology relates colloidal quantum dot lasers.

BACKGROUND

Colloidal quantum dots (CQDs) exhibit efficient photoluminescence with widely tunable bandgaps, owing to quantum confinement effects. They are emerging as an appealing complement to epitaxial semiconductor laser materials which are ubiquitous and technologically mature, but unable to cover the full visible spectrum (red, green, and blue-RGB). However, the requirement of high CQD packing density and the complication by nonradiative multi-excitonic Auger recombination have been obstacles for advancing colloidal CQD laser development.

SUMMARY

The methods and materials described herein contemplate the use films of colloidal quantum dots as a gain medium in a vertical-cavity surface-emitting laser. The present disclosure demonstrates a laser with single-exciton gain in the red, green, and blue wavelengths. Leveraging this nanocomposite gain, the results realize a significant step toward full-color single-material lasers.

In one aspect, a laser includes a film of colloidal quantum dots as the optical gain medium.

In one or more embodiments, the colloidal quantum dots comprise hydrophobic surface ligands.

In one or more embodiments, the colloidal quantum dots comprise aromatic surface ligands.

In one or more embodiments, the colloidal quantum dots have a core-shell structure comprising a core and a shell.

In one or more embodiments, the core diameter is in the range of 2-10 nm.

In one or more embodiments, the shell thickness is in the range of 1-5 nm.

In one or more embodiments, the core-shell bandgap difference is about 1-2 eV as measured for bulk-equivalent materials.

In one or more embodiments, the colloidal quantum dots are CdSe/ZnCdS.

In one or more embodiments, the colloidal quantum dots are type-I quantum dots.

In one or more embodiments, red, green, and blue wavelength lasing is enabled.

In one or more embodiments, the gain medium is enabled by a single-exciton gain mechanism.

In one or more embodiments, the packing density of colloidal quantum dots in the film is between 50% and 100%.

In one or more embodiments, the film is a spin-cast self-assembled film.

In one or more embodiments, the amplified spontaneous emission threshold of the optical gain medium is at energy densities less than 90 $\mu J/cm^2$.

In one or more embodiments, the laser's stimulated emission time exceeds the Auger time constant of the quantum dot film.

In one or more embodiments, the film supports more than 1 GHz frequency acoustic wave propagation.

In one or more embodiments, the film of colloidal quantum dots is positioned in a resonant laser cavity.

In one or more embodiments, the laser is a vertical-cavity surface-emitting laser.

BRIEF DESCRIPTION OF THE DRAWINGS

The invention is described with reference to the following figures, which are presented for the purpose of illustration only and are not intended to be limiting. In the Drawings:

FIG. 1 shows the structural characteristics of CQDs and their spin-cast closely packed films, according to one or more embodiments. (a) Transmission electron microscope (TEM) image of a red CQD cluster displaying finite shape anisotropy. (b) High resolution TEM of a single red CQD demonstrating a well-defined lattice of crystalline structure. (c) Angled cross-sectional view of CQD film on fused silica under scanning electron microscopy. The small grains in the image are due to 15 nm thick metallic (Au—Pd) coating to reduce charging effects and image distortion. The films are 250 nm thick with an effective refractive index of 1.73, indicating a packing density of 50% (extrapolated from the refractive indices of bulk materials ($n_{CdSe}$=2.5; $n_{ZnS}$=2.36). (d) Morphology of a smooth CQD film surface analyzed by atomic force microscopy. For an area of 1 $\mu m^2$, the RMS and peak-to-peak surface roughness were ~2 nm and ~15 nm (<<$\lambda$), respectively. (e) A thicker CQD film on n-Silicon substrate showing the presence of a crack reminiscent of cleavage or breakage by strain in crystalline epitaxial films.

FIG. 4 shows optically pumped CQD-VCSELs in the red and green, according to one or more embodiments. (a) A schematic of vertically pump CQD-VCSEL with long pass filter to remove any residual pump excitation beam. CQD gain media was placed inside a resonant cavity which was made by two distributed Bragg reflectors (DBRs) with reflectivity higher than 99%. Laser light is produced above threshold. (b) (c) Photographic images of red and green CQD-VCSELs showing spatially well-defined output beams which are collinear with the pump beam (FIG. 11). (d) Spectra from a red CQD-VCSEL structure below and above threshold. (Inset) Single mode lasing for a green CQD-VCSEL from a shorter cavity. From the linewidth of laser emission, the quality factor of cavity was estimated about 1300. (e) Emergence of laser modes from spontaneous emission in a CQD-VCSEL when increasing pump power.

FIG. 8 shows stripe width measurements, according to one or more embodiments. (a) A sketch of the experiment setup with a movable blade to scan along and across the focused excitation beam; a power meter was used to measure transmission intensity of the beam after the blade. (b) The measured intensity as function of blade position (z-axis) whereby its first derivative yields the beam profile. (c) The focused beam width as a function of blade position (x-axis).

DETAILED DESCRIPTION

The methods and materials described herein the use of CdSe/ZnCdS core/shell CQDs with aromatic ligands in achieving single-exciton gain in RGB densely packed CQD films. Consequently, the threshold of amplified spontaneous emission (ASE) is reached at very low energy densities of 90 $\mu J/cm^2$, more than one order of magnitude improvement from reported values. Leveraging this nanocomposite gain, the present disclosure provides the first colloidal-quantum-dot vertical-cavity surface-emitting lasers (CQD-VCSEL). Our results realize a significant step toward full-colour single-material lasers.

CdSe-based CQDs are widely applied from fluorescent bio-labels to prototype light-emitting diodes. However, their use as gain media for lasers has been challenged by both practical and fundamental obstacles. One key challenge is realization of high-performance optical gain medium, wherein each individual CQD preserves its quantum size effect and high quantum efficiency and a dense assembly of CQDs offers a homogeneous optical continuum. For ideal spherical type-I CQDs, requirement for light amplification is that the ensemble averaged number of exciton per CQD is greater than unity, $<N>>1$, signifying an exact balance between absorption and stimulated emission for ensemble averaged single exciton occupancy per CQD. This condition is referred to as biexciton gain. When adding the electronic structure and inclusion of biexciton states", the gain threshold will be closer to $<N>$~1.5 whereupon a fundamental complication comes from enhanced non-radiative multiexciton (Auger) recombination in nanometer size systems. The Auger process, for example in CdSe-based CQDs ($\tau_{Auger}$~100 ps), is two orders faster than photoluminescence (PL) decay, severely hindering the dynamic buildup of population inversion. Quantum rod structures were investigated to reduce Auger processes but this also dilutes joint electronic density of states thereby reducing interband oscillator strength. Elsewhere, for type-II CQDs in which electrons and holes are likewise separately confined, a positive biexciton binding energy shifts the absorption spectrum of single exciton CQDs off their emission. This biexciton level shifting enables single-exciton gain where the Auger process is inhibited. However, apart from challenges in type-II CQD synthesis, a decrease in interband optical oscillator strength significantly reduces the optical gain and PL rate. Herein we demonstrate single exciton gain in type-I CQDs as a powerful solution to achieve high optical performance of CQDs towards full colour CQD semiconductor lasers.

Figure 5:
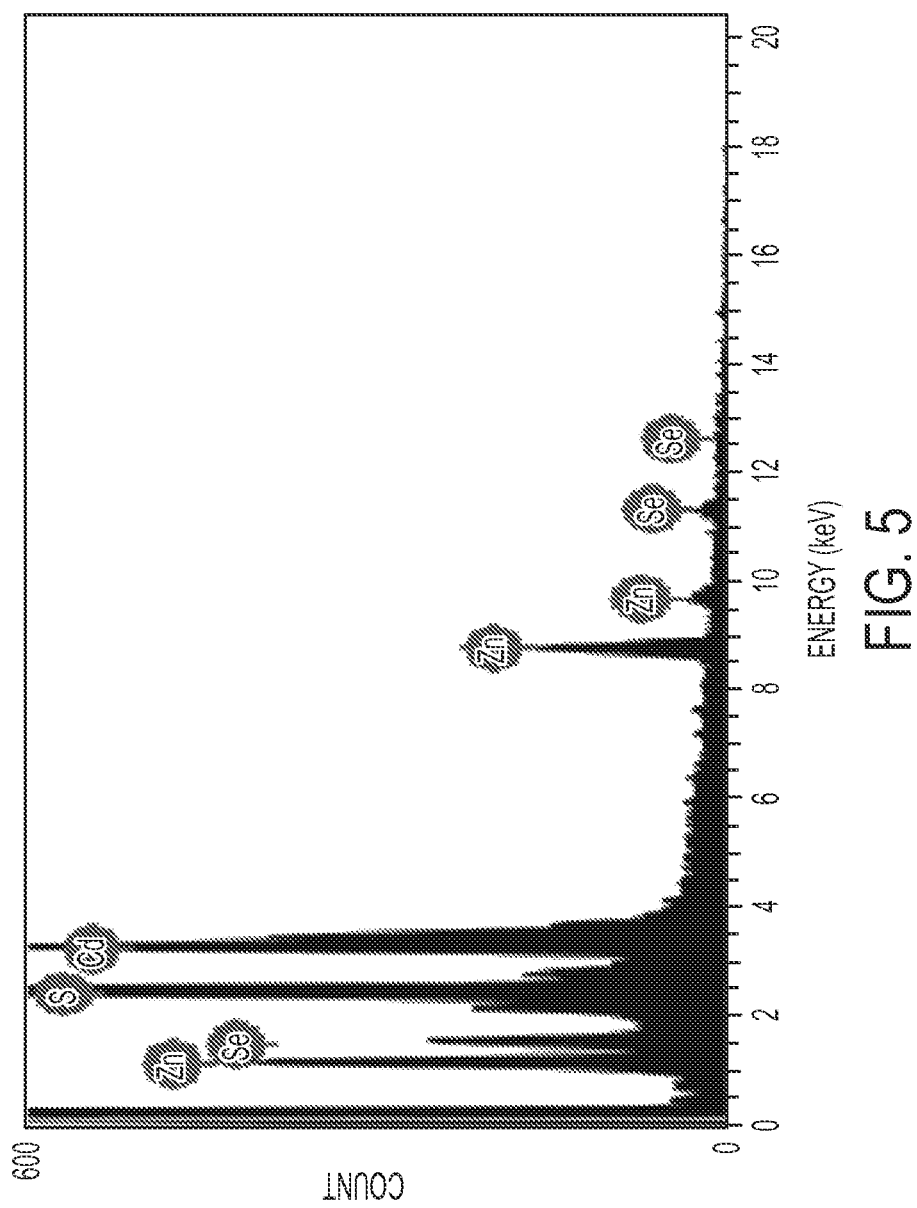
FIG. 5 shows energy-dispersive X-ray spectroscopy analysis of the red CQD films showing all four elements of CdSe/$Zn_xCd_{1-x}S$ core/shell structure, according to one or more embodiments.

Our RGB type-I CdSe/Zn$_{0.5}$Cd$_{0.5}$S core/shell CQDs were prepared by high temperature organometallic synthesis with nominal CdSe core diameters of 4.2 nm, 3.2 nm, and 2.5 nm, respectively. A thin (1 nm) ternary shell with large Cd-fraction Zn$_{0.5}$Cd$_{0.5}$S (FIG. 5 and Table SI) reduces strain and creates a moderate core-shell bandgap difference (~1.3 eV in bulk-equivalent materials). The Cd composition provides maximum alloy potential fluctuations which in single II-VI crystals lead to spatial localization of exciton wave-functions. The TEM images (FIG. 1a, b) show well-defined crystallinity with anisotropic particle shapes. The distinct 'pyramidal-like' shape together with moderate core-shell bandgap difference and maximum alloy potential fluctuation of the Zn$_{0.5}$Cd$_{0.5}$S shell modify the electronic states from those of the ideal spherical CQDs (e.g. by removing valence band degeneracies) which have been the staple for theoretical models. For example, shape-engineered CdSe/CdS sphere/rod nanostructures have been used to study altered carrier confinement on excitonic interactions in which the distinct separation between absorption and PL spectra then enabled optical gain with threshold <N>=0.95, lower than theoretical value for ideal spherical CQDs.

The present disclosure provides a quantum yield (QY) exceeding 80% at exceptionally high concentrations in starting solution (148 mg/ml) for subsequent spin-cast self-assembled CQD films (FIG. 1c). The CQD films exhibit optically smooth surfaces (FIG. 1d), known to be provided by robustly hydrophobic ligands. Effective refraction index of the films is n=1.73, with very low background scattering, suggesting a packing density of about 50% (Eq. S1), strikingly high when considering the theoretical limit for identical spheres: $\pi/\sqrt{18}$~74%. The mechanical continuity and cohesiveness of the films were validated by observing GHz ultrasound propagation (FIG. 6). Under low speed spinning conditions, we could even create well-defined cracks (FIG. 1e), reminiscent of cleavage by built-in strain of single crystal epitaxial thin films.

Figure 2A:
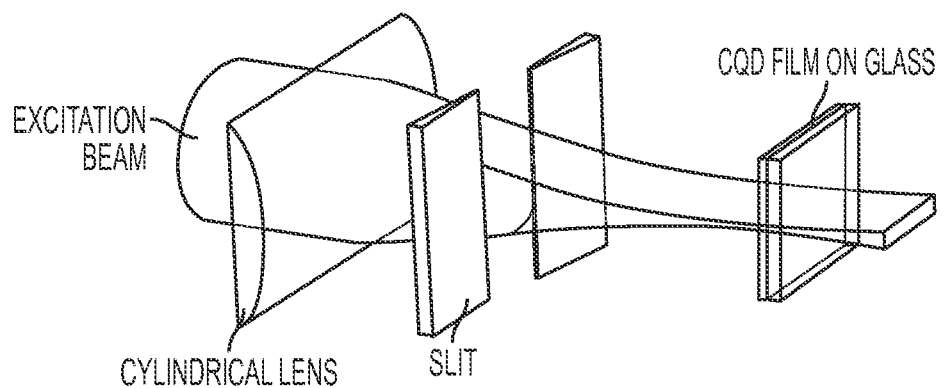
FIG. 2 shows edge emission in stripe excitation geometry over a range of pumping levels, according to one or more embodiments. (a) Experimental configuration with a cylindrical lens focusing ultrashort (100 fs) pulse laser excitation at a fixed wavelength of $\lambda$=400 nm as a stripe on a CQD film; a slit for precise stripe length control. (b) Plan view photographs of emission from excited stripes of RGB CQD films, respectively; stripe length and width are 1 mm and 10.5 um, respectively (FIG. 8). The RGB bright spots at the film edges seen above threshold levels are clear visual evidence of ASE. (c) Edge emission as function of pump energy density for RGB CQD films, with arrows indicating the ASE energy density thresholds of 90 $\mu J/cm^2$, 145 $nJ/cm^2$ and 800 $\mu J/cm^2$, respectively, (d)(e) Spectral analysis of edge emission, together with absorption peaks of the lowest exciton state for red and green CQD films. The lowest exciton absorption peaks were isolated from full spectrum absorbance results (FIG. 9). Additionally, the full-width at half maximum (FWHM) of the spectral peaks narrows from 28 nm to 7 nm for these red and green CQD films.
Figure 2B:
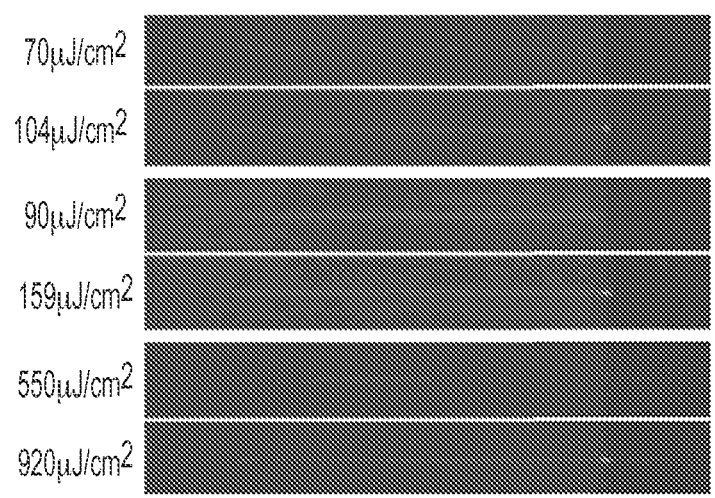
Figure 2C:
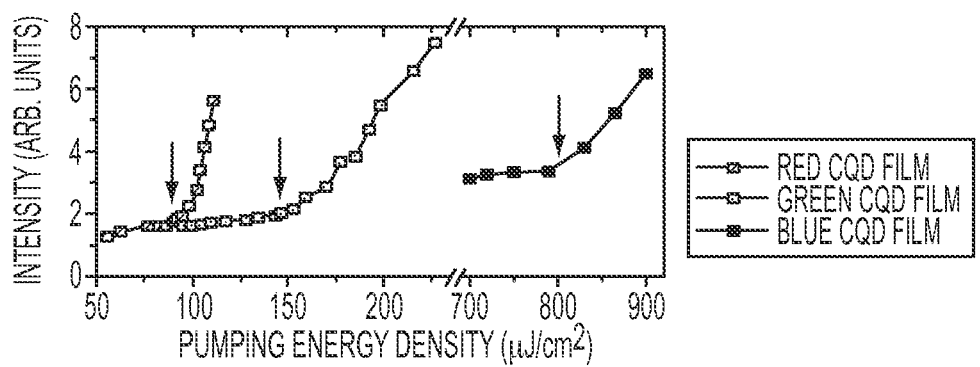

The dynamics of optical gain in CQD films were studied in pulsed stripe photoexcitation experiments, FIG. 2a. Emission from the film edge with increasing pump power exhibits a clear transition from PL to stimulated emission (here observed as ASE) by an abrupt increase in output intensity and spectral narrow (FIG. 2b-e). FIG. 2c displays the ASE thresholds for CQD films of 90 µJ/cm², 145 µJ/cm² and 800 µJ/cm² in RGB colours, respectively. The values for red and green films represent an improvement of more than one order of magnitude from commonly reported values (>1 mJ/cm²) for similar colours in both type-I" and type-II CQDs. The ASE for deep blue CQD films is demonstrated here for the first time (FIG. 7) though at higher threshold, mainly due to the reduced absorption at the 400 nm pump wavelength of this high bandgap CQD. Indeed, accounting for these pumping thresholds and the measured packing density (FIG. 8, and equation SI), we can quantify: <N>~0.80, 0.76 and 0.73 for ASE thresholds of the three RGB CQD films, respectively. These values are distinctly below theoretical values for biexciton gain in homogeneously broadened spherical type-I CQDs: <N>=\, and only slightly above that of single-exciton gain in ideal type-II CQDs: <N>=2/3.

Figure 2D:
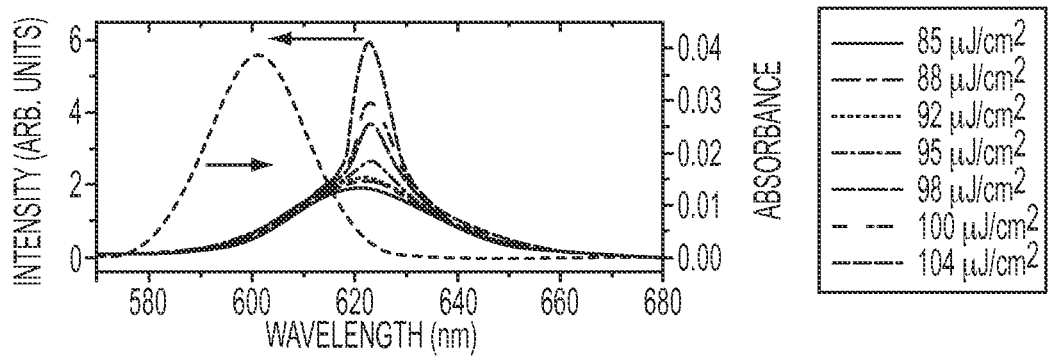
Figure 2E:
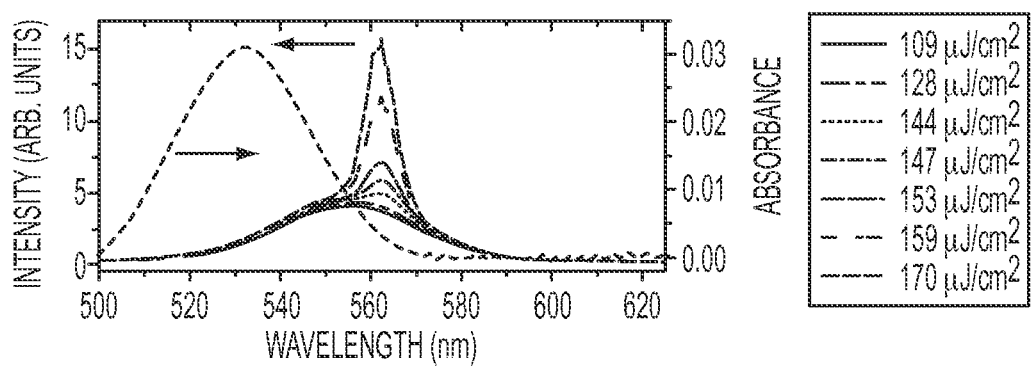

The lowest exciton absorption peaks (1S$_e$-1S$_h$ transition) in FIG. 2d, e show well-defined Gaussian shapes, distinctly blue-shifted with respect to PL. This Stokes shift reduces the self-absorption of emitted photons—thereby lowering the ASE threshold. Spectrally, the ASE emerges from the absorption edge tail, slightly on red side of PL, reflecting the optimal wavelength at which the gross optical gain and finite self-absorption are balanced, a phenomenon seen e.g. with green-blue II-VI semiconductor quantum well lasers as well as organic dye gain media.

Figure 3A:
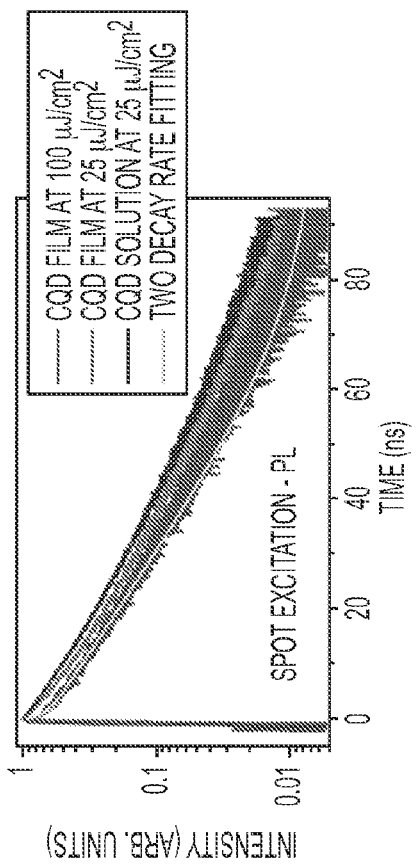
FIG. 3 shows the dynamics of CQD light emission from epitaxial-like thin films under various excitation conditions, according to one or more embodiments. (a) Spectral analysis of the edge emission in stripe excitation for red CQD film, integrating for two different time windows: 0-40 ps and 300-640 ps after impulsive pumping. (b) PL decay of the red CQD in small round "spot" excitation geometry at different preparations. The spot diameter is 22 um, whose gain length is incapable of supporting ASE. The two exponential decay rate fitting is for CQD film at 100 $\mu J/cm^2$ excitation. (c) High temporal resolution of the fast PL and the ASE decays in the spot and stripe excitation geometries, respectively. Excitation levels are above ASE thresholds for each CQD film. (d) Spontaneous emission intensity of CQD film as a function of excitation level represented as an average number of generated excitons per CQD, compared with our theoretical model—see Eq. S2 and S3. The arrows show the excitation levels corresponding to the ASE thresholds.
Figure 3B:
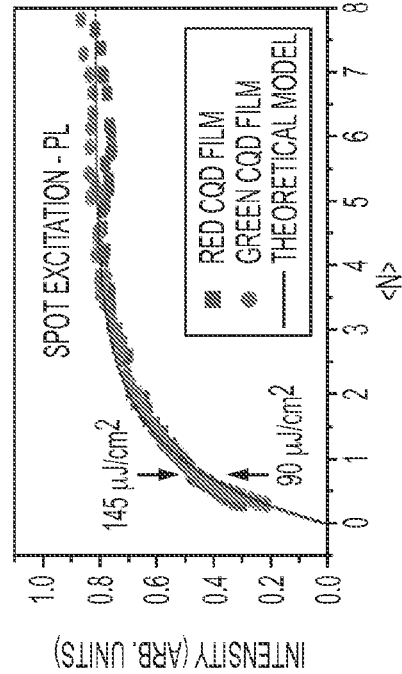
Figure 3C:
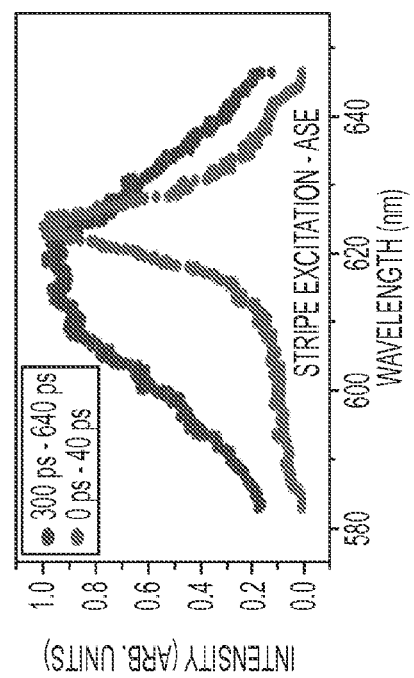

The transient spectra of the ASE in FIG. 3a show that the spectrally narrow, red-shifted ASE only occurs at very fast time scales (0-40 ps) after impulsive excitation. In the subsequent time window (300-640 ps), the broader PL is the dominant emission. Under small diameter (22 µm) circular "spot" excitation geometry (FIG. 3b) where short optical path length prevents ASE, PL at high excitation level (>ASE threshold) shows two identifiable decay rates. The slower rate is similar to single-exciton decay in the low excitation regime, Ti~14.2 ns, comparable to that of CQD solution (~15.8 ns). These measurements suggest that our CQDs retain approximately 90% of their QY when transferred from solution into densely packed films. The faster rate was resolved by a streak camera (FIG. 3c): T2~126 ps (red) and 101 ps (green), consistent with rates of Auger recombination for respective CQD size. However, only a small fraction of emission energy was released at this faster rate whereby single-exciton emission dominates the radiative process. FIG. 3c also shows very fast ASE decay in comparison to the "Auger-dictated" PL component. The measurement is limited by streak camera resolution of 16 ps. Employing variable stripe length (VSL) method, we showed that the edge emission intensity reaches saturation with the excitation stripe length exceeding 1.1 mm (FIG. 10), corresponding to a photon travel time of ~6 ps in a CQD film. This radiative gain depletion time implies highly proficient stimulated emission which is more than an order of magnitude faster than the Auger recombination. The VSL method also provided an estimate of the modal gain as 95±10 cm" (red CQD film at 120 µJ/cm²) and 60±10 cm" (green CQD film at 155 µJ/cm²) at the ASE peak. These net gain coefficients are comparable to those in other reports—but here achieved at much lower pumping levels.

Quantitatively, the number of excitons per CQD, n, can be taken as a Poisson distribution:

$$P(n) = \frac{(N)^n e^{-(N)}}{n!}.$$

Figure 3D:
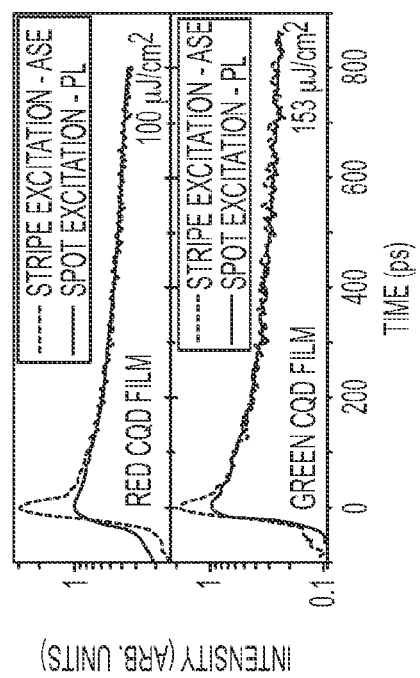

In time resolved PL, the fast decay is contributed by CQDs with multiexciton: P(n>1) and the slow decay is contributed by all excited CQDs: P(n>0). The ratio between these two contributions is experimentally given (FIG. 3b for red CQD film at 100 µJ/cm²) as 0.39, which corresponds to <N>=0.92. Therefore, at the ASE threshold level (90 µJ/cm²), we have <N>=0.83, very good agreement with above direct measurement <N>=0.80. One also can see the small but finite loss by Auger process even at single exciton gain threshold <N>=0.80 as P(n>1)-19%. The loss would be highly detrimental if higher excitation levels are required, as with other reported ASE thresholds". By contrast, in our densely packed CQD films, the ASE process is so fast (~6 ps) as to readily overcome this Auger loss. With increasing excitation levels in spot excitation, it can be seen directly how Auger loss decreases quantum efficiency (FIG. 3d). Experimental results for both green and red CQD films agree very well with the disclosed theoretical model (Eq. S3). Specifically, excitation levels at the ASE thresholds (in FIG. 2) fall within the linear regime of this PL model, confirming the nature of single-exciton emission in these excited CQDs. Therefore, ASE in these films must originate from single exciton gain.

Given their demanding gain/loss criteria, VCSELs are among the most challenging device configurations for any optical gain material. The present disclosure provides the first optically pumped CQD-VCSELs (FIG. 4a). FIG. 4b, c show two CQD-VCSELs lasing with well-defined spatial coherence (beams) in the red and green, respectively. Below threshold pumping level, the PL spectra in FIG. 4d shows Fabry-Perot microcavity modes. Above threshold, sharp laser lines appeared in the CQD gain spectrum coincident with the cavity modes and emergence of a spatially coherent beam. The inset of FIG. 4d shows the single mode green CQD-VCSEL at shorter cavity length. The lasing onset in FIG. 4e shows the pumping threshold for red CQD-VCSEL as ~60 $\mu J/cm^2$. Because of the very low DBR reflectivity at the 400 nm pump wavelength (R<5%), a single pass of the pump beam through the CQD layer can be assumed. This indicates that the threshold for this CQD-VCSEL corresponds to exciton occupancy as low as <N>=0.53, showing how low loss resonators reduce stimulated emission thresholds, closer to the fundamental "intrinsic" single exciton limit. The overall efficiency of the red CQD-VCSEL is 0.4% at excitation energy density of 140 $\mu J/cm^2$, and lasting few minutes before fading out as commonly seen in other conventional VCSELs without any heat sinking. The performance can be vastly improved with device optimization.

In conclusion, very low thresholds of ASE across RGB spectrum and the first CQD-VCSELs were enabled by single-exciton gain in type-I CQD films. The single exciton gain was confirmed by four independent experimental results: direct absorption measurement, multiexciton contribution via time resolved PL, linear dependence of PL intensity on excitation energy at threshold levels, and very low CQD-VCSEL threshold. The demonstration of overcoming the Auger barrier for stimulated emission in these CQD materials is successful with a compact, sub-nanosecond pulsed diode laser as a pumping source (FIG. 12). This emphasizes the benefits of single exciton gain towards producing practical CQD lasers, namely that stimulated emission is achievable even on a time scale which exceeds the Auger time constant.

Methods

The effective refractive index of CQD films was measured by ellipsometry technique at a wavelength of 632.8 run (He—Ne laser). All the experiments in this work were performed at room temperature and under ambient conditions. The ultrafast impulsive laser excitation source was a frequency-doubled amplified titanium-sapphire pulsed laser (Coherent Reg A Model 9000, 400 nm wavelength, 100 fs pulse width, 100 kHz repetition rate). While impractical in any real devices, such a source is advantageous for the investigative work which we report. As shown in FIG. 12, much longer pump laser pulses (sub-nanosecond) could likewise be used to elicit stimulated emission. A time correlated single photon counting system and streak camera for the transient spectroscopy experiments at two different time scales was employed.

For fabricating the high reflectivity DBRs, 8 pairs of quarter-wavelength thick Si layers for the red CQD-VCSELs were deposited on flat fused silica substrate by Argon ion sputtering. For green CQD-VCSELs, dielectric mirrors from CVI Melles Griot were used. A narrow stripe of 30-µm-thick SU-8 was placed at one edge of a DBR to create a finite wedge for a prior built-in thickness variation of the final cavity. A drop of highly concentrated CQD solution was placed atop this DBR, and then a complete CQD-VCSEL structure was made by placing the second DBR on top. CQD solution was mildly squeezed and dried between these two DBRs which form a Fabry-Perot cavity. The density of self-assembled CQD wedge inside cavity can be improved to the level of quality of the spin-casted epitaxial-like CQD films for higher CQD-VCSEL performance.

Quantifying the Atomic Composition of $CdSe/Zn_xCd_{1-x}S$ Core/Shell CQD Structure Energy-dispersive X-ray spectroscopy (EDS) was used to quantify the composition of $CdSe/Zn_xCd_{1-x}S$ structure.

By analyzing the EDS results (FIG. 5), the weight and atomic percentages of the individual elements in $CdSe/Zn_xCd_{1-x}S$ core/shell structure are summarized in Table SI. The atomic percentage of Cd (27.20%) is the contribution of Cd in CdSe core and Cd in $Zn_xCd_{1-x}$ shell. The former is considered to be similar to Se percentage (7.9%); thus the latter is 19.23%. From the atomic percentage of Zn (19.92%), one can calculate: x~0.51, which agrees well with our target shell material $Zn_{0.5}Cd_{0.5}S$.

TABLE SI

Weight and atomic percentages of individual elements in $CdSe/Zn_xCd_{1-x}S$ core/shell structure.

| Element | Weight % | Atomic % |
|---------|----------|----------|
| S       | 22.40    | 44.91    |
| Zn      | 20.26    | 19.92    |
| Se      | 9.78     | 7.97     |
| Cd      | 47.56    | 27.20    |
| Totals  | 100.00   | 100.00   |

CQD Films Support High Frequency Ultrasound Propagation.

A nondestructive method using ultrafast optoacoustics to test for the material continuum of our laser films from their ability to support the propagation of sound waves was employed. The epitaxial-like CQD films (300 nm thick) were spin casted on fused silica substrate; then a 90 nm Aluminum layer was deposited atop the CQD films by electron-beam evaporation.

Figure 6B:
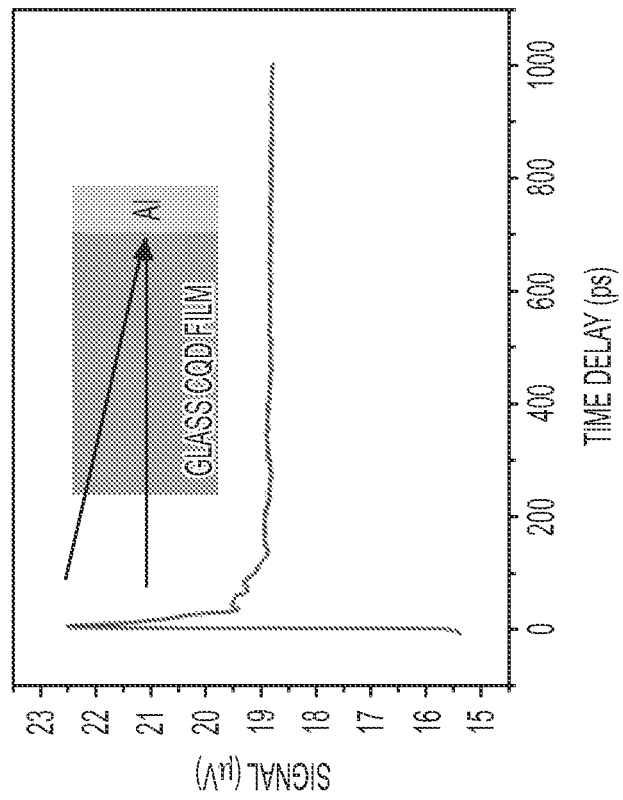
FIG. 6 shows the results of pump-probe experiment used to study high frequency ultrasound propagation in the densely packed CQD thin films, according to one or more embodiments. (a) The transient reflected probe-beam intensity (indicated as signal on lock-in amplifier), as a function of probe beam delay time after impulsive pump at t=0 ps; inset, the material structure for experiment, where 90 nm thick Aluminum acousto-optic transceiver layers were deposited on 300 nm thick CQD films (spin casting the high concentration CQD solution on fused silica substrate). (b) After background subtraction, the coherent oscillations appear as the telltale signal for showing the films' ability to support >1 GHz frequency acoustic wave propagation, thus demonstrating the epitaxial-like thin film material.
Figure 6A:
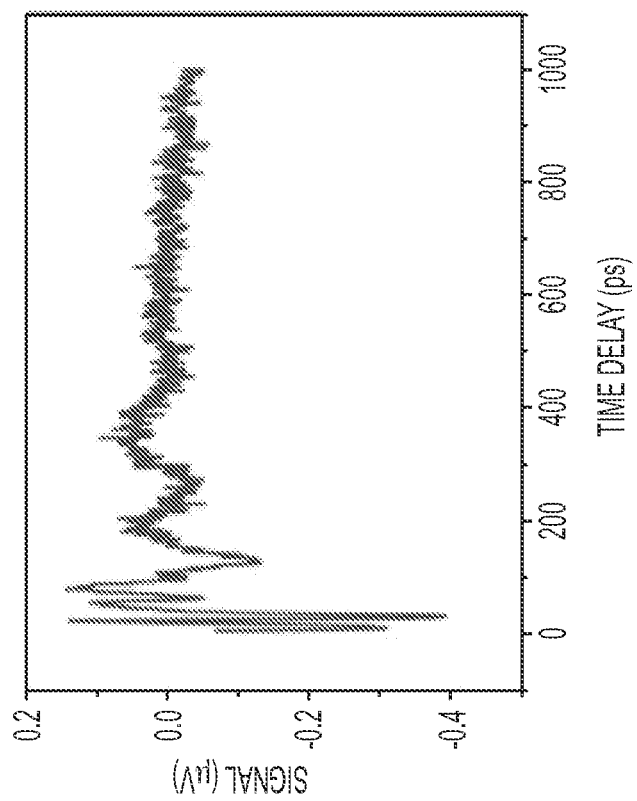

The optoacoustic method works as follows: ultrashort (100 fs) laser pulses at a wavelength $\lambda$=790 nm (ultrasound generating pump beam) is sent through the substrate glass and CQD film to the Al film at incident angle of 45° (inset of FIG. 6a). The Al film absorbs the laser pulse and, through instantaneous thermal expansion (on ps time scale) acts as optoacoustic transducer to generate a high frequency (~10 GHz) ultrasound impulse. This strain pulse then propagates into CQD film. The second ("probe") laser pulse arrives at the structure at normal incidence and its transient reflection (from strain induced index of refraction change) is monitored by a photodiode (plus lock-in amplifier electronics). FIG. 6a shows the modulated probe beam reflection as a function of delay time between pump and probe pulses. The very fast electronic cooling curve after absorbing pump pulse and very fast oscillation as a result of strain pulse propagating and reflecting inside aluminum transceiver layer were subtracted from raw data in FIG. 6a. FIG. 6b yields the useful subtracted signal which shows transient oscillations as a result of optical interference between a probe beam reflecting from the propagating strain pulse (in CQD films) and probe reflection beams from the Al surface. Such oscillations are telltale signs of the ability of a material to support high frequency (~10 GHz) acoustic waves and characterize the propagating ultrasonic wave fronts. Here, the period of this oscillation (T~150 ps)

indicates the velocity of the ultrasonic wave v=λ/2 nT=1.6 nm/ps (estimated refraction index of CQD film: 1.6, at λ=790 nm), which is slightly higher than that of water (1.5 nm/ps) or soft metal Pb (1.3 nm/ps). Although due to finite acoustic wave scattering the sound velocity cannot be compared directly with values obtained with this technique for single crystal materials (where propagation velocities are ~5-6 nm/ps), the results are important in showing that our CQD films do support ultrasonic sound propagation; hence the appellation of "epitaxial-like" thin film material.

Amplified Spontaneous Emission from Blue CQD Films

Figure 7:
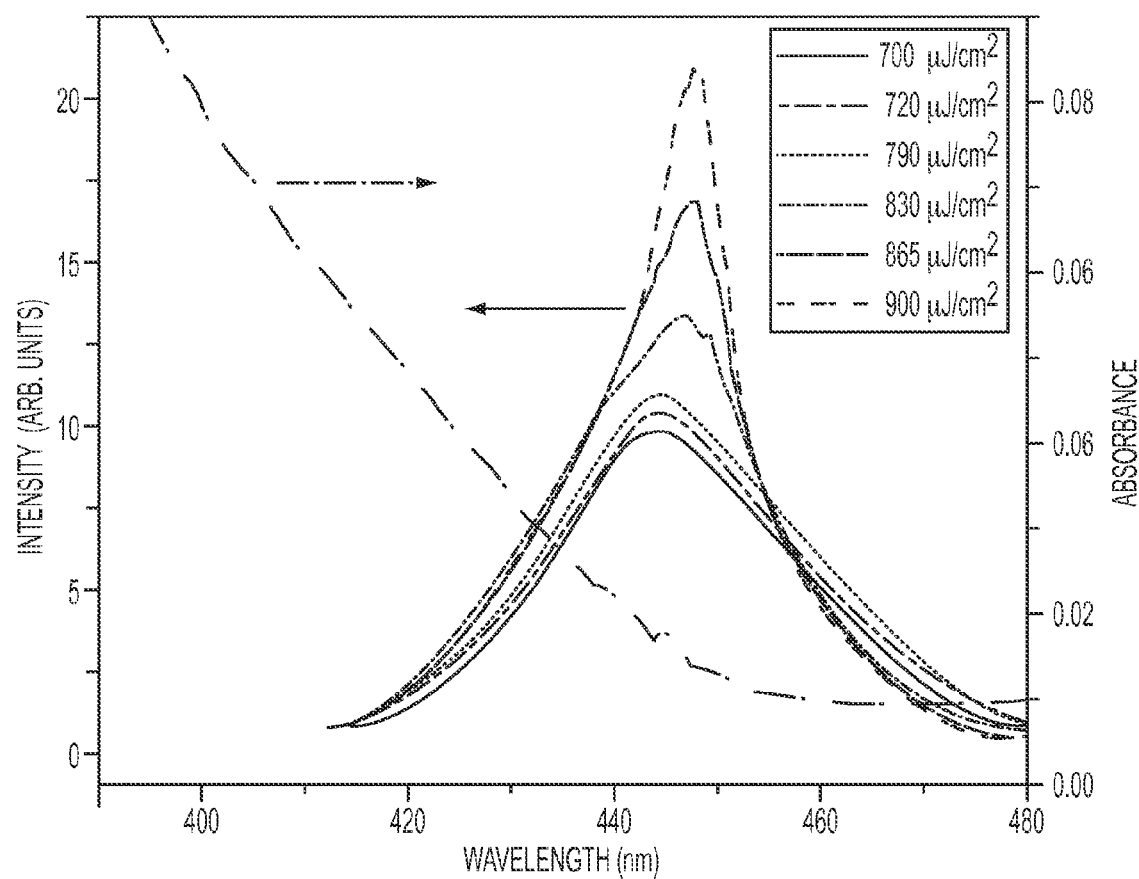
FIG. 7 shows spectral analysis of edge emission in stripe excitation configuration and absorbance of the blue CQD film, according to one or more embodiments. The ASE threshold is clearly demonstrated by abrupt intensity increase and spectral narrow.

The ASE behavior here is similar to the green and red CQD films, so that e.g. the spectra of edge emission in blue CQD films shows clear transition from PL to ASE when increasing pumping levels (FIG. 7). The abrupt intensity increase and spectral narrow occur when excitation level exceeds the threshold of ~800 uJ/cm$^2$. The value is high (by standards of this paper) and assigned in large part to the low absorbance of blue CQD films at our fixed 400 nm pump wavelength (in comparison with that of green and red CQD films). We note that the lowest exciton absorption peak is not very clear, either, because of the complication in low energy confinement barrier of ternary shell Zn0.5Cd0.5S in this wide band gap CQD. Yet, the ability to form densely packed, optically homogenous "epitaxial-like" blue CQD films and their nature of single exciton gain have been able to produce stable ASE and laser action.

Calculation of Average Number of Exciton per CQD

The average number of excitons per CQD in the epitaxial-like films under spot or stripe excitation condition can be accurately obtained from the following:

$$\frac{I_i - I_t - I_r}{f} = (N)\frac{ATD}{V}E_p \quad (S1)$$

where $I_i$, $I_t$, $I_r$ are the time integrated intensities of the incident, transmitted, and specularly reflected pump beams, respectively; f is the pump pulse repetition rate (100 kHz); A is the measured excitation area; T is the thickness of the CQD film (from SEM and ellipsometry results) and D is the film packing fraction (extrapolating as 0.5 when compared effective refractive index of CQD films, n=1.73, with that of bulk CdSe, n=2.5, and ZnS, n=2.36). The average volume of a single CQD (from TEM data) is denoted as V, and $E_p$ is excitation photon energy (3.1 eV). The intensity of incident, transmitted, and specularly reflected beams were continuously monitored during the experiment. Note that the <N> calculated by this experimentally direct approach is likely to represent an upper limit. The actual value of <N> can be smaller because finite light scattering of excitation in real experiment is not considered in equation S1. The stripe length in ASE configuration is readily measured via slit width. The accuracy of excitation area (A) relies on the measurement of excitation stripe width in the ASE experiments or the measurement of focusing-spot diameter in spot excitation.

FIG. 8a sketches the setup where a sharp blade edge was aligned parallel to the stripe while the blade was moved across the stripe (z-direction), and the transmitted beam was captured by a calibrated average power meter. After measuring the power as a function of blade position (z-position), the first derivative of this quantity, representing the beam intensity profile, was fitted into a Gaussian function (FIG. 8b) to find the full-width at half maximum (FWHM) of the stripe. Then the blade was moved along the lens axis (X direction) to measure the waist and also depth of focus of the excitation (FIG. 8c). The measurement yielded a stripe width at the waist as 10.5 urn, in very good agreement with estimated size (9.67 μm) when focusing an ideal input Gaussian beam (A,=400 nm and 2 mm diameter) by a 38 mm focal length lens. An 8 cm focal length lens used for spot excitation focuses the similar laser beam into a spot of 22 urn in diameter, the value which was measured by a very similar method.

Identification of the Lowest Exciton State from Absorbance Measurements

Figure 9A:
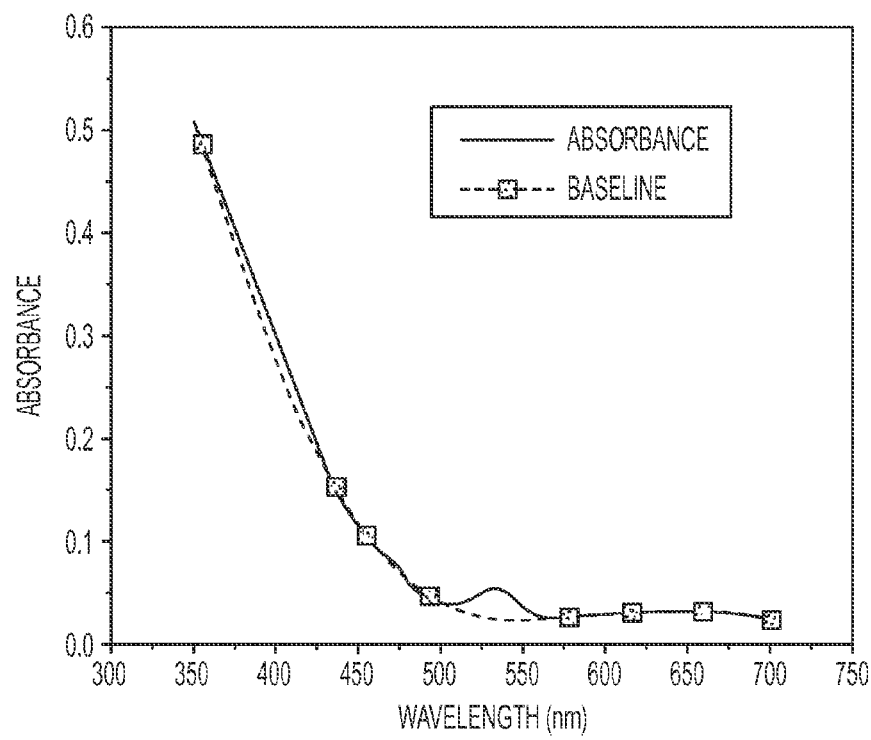
FIG. 9 shows analysis of CQD film absorbance, according to one or more embodiments. (a) The raw absorbance of a 'green' CQD film with the visible lowest exciton state near 535 nm and the superposed 'interpolating background curve' (in red). (b) After subtraction of the interpolating function, revealing several Gaussian absorption peaks.
Figure 9B:
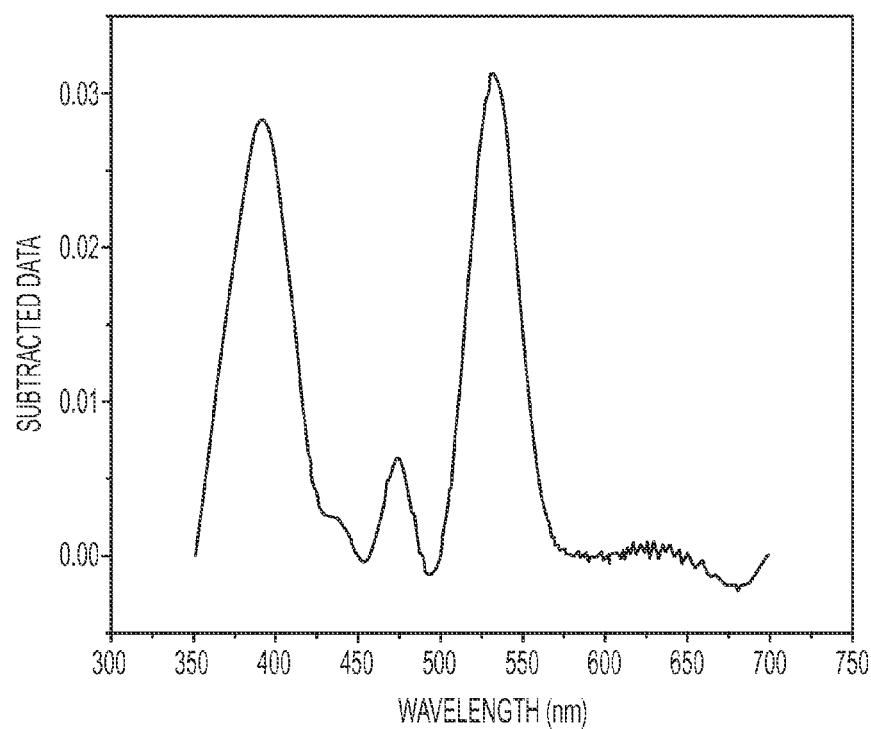

An interpolation technique applied to raw absorbance data from the thin films to generate a smooth background baseline in the full absorbance spectrum as in FIG. 9a was employed. By this physically realistic approach, the excitonic resonances (as distinct peaks) can be isolated by subtracting this background from the raw absorbance spectrum. The subtracted data suggests three distinct peaks in FIG. 9b. However, while the lowest exciton state corresponding unambiguously to the $1S_e$-$1S_h$ transition is clearly resolved and procedurally stable as displayed in FIGS. 2d and 2e of this letter, the other higher photon energy peaks are very sensitive to details of the interpolating technique (and not relevant to the main theme of the article).

Modal Gain of Epitaxial-Tike CQD Films.

The measurements show the optical gain behaviors before reaching the saturation at the stripe length greater than 1.1 mm. The pumping levels are 120 μJ/cm$^2$ and 155 μJ/cm$^2$ for red and green CQD films, respectively.

Figure 10:
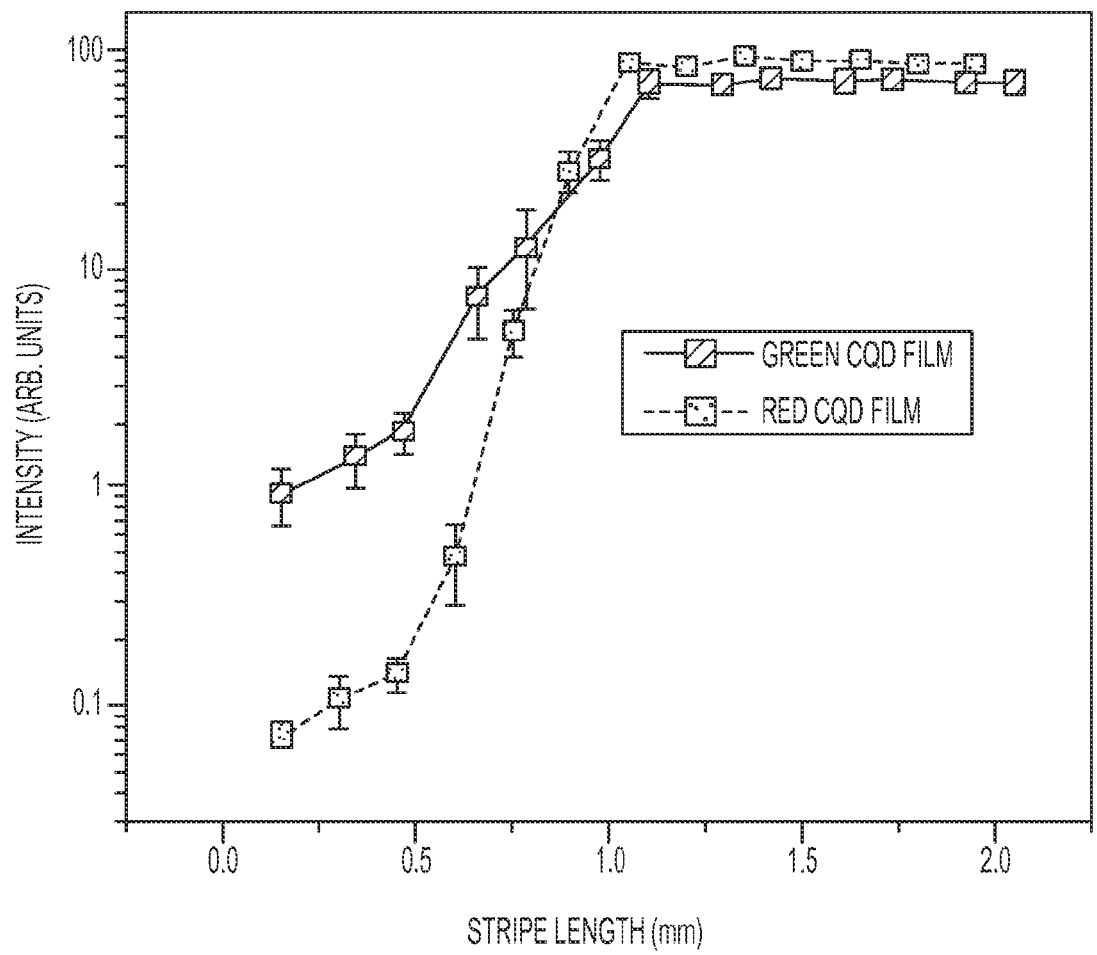
FIG. 10 shows the edge emission intensities as functions of stripe length in green and red CQD films, according to one or more embodiments.

Using variable stripe length method, we measured the edge emission ASE intensity as a function of stripe length for both green and red CQD films (FIG. 10). The ASE intensities increase with stripe length increase as optical gain behaviors before reaching the saturation at the stripe length greater than 1.1 mm. The modal gains at the ASE peaks are estimated as 95±10 cm" and 60±10 cm" for red and green CQD films at 120 μJ/cm$^2$ and 155 μJ/cm$^2$ pumping level, respectively. The intensity saturation occurs at the stripe length exceeding 1.1 mm, implying that the gain depletion time of 6 ps, the travel time for a photon in these CQD films (refractive index of 1.7).

A Model for Spontaneous Emission of Multiexciton Quantum Dots

In the disclosed spontaneous emission model, the number of emitted photons per CQD is given by $$I(<N>)=P(1)\beta_1+P(2)(\beta_1+\beta_2)+P(3)(\beta_1+\beta_2+\beta_3)+\ldots =$$
$$\Sigma_{i=1}^{\infty}\beta_i[1-\Sigma_{n=0}^{i-1}P(n)] \quad (S2)$$

where (N) is average exciton per CQD, $\beta_i$ is the quantum efficiency of the $i^{th}$ exciton, n is the number of exciton in a CQD, and P(n) is Poisson distribution of n in the ensemble. $\beta_i$ is 0.8 (quantum yield at low excitation level—single exciton state). If there are two excitons in a CQD, the "extra" one has two possibilities to recombine: non-radiative Auger recombination (rate: $T_2^{-1}$) and spontaneous recombination (rate: $T_1^{-1}$). Thus the biexciton quantum efficiency is $\beta_2=\beta_i*$ $$\frac{T_1^{-1}}{T_1^{-1}+T_2^{-1}},$$

which is very small in our CQD films (0.007 and 0.005 for red and green respectively).

If a CQD has more than two excitons, the non-radiative Auger process will become even more likely and thus further decrease the quantum efficiency. The system will emit mostly like biexciton CQDs. In other words, $p_{i>2}$ are irrelevant and the equation S2 becomes:

$$I(<N>=[1-P(O)]\beta_1+[1-P(0)-P(1)]\beta_2 \quad (S3)$$

The equation S3 is represented as a theoretical model line in FIG. 3d. The model agrees very well with experimental results for both green and red CQD films.

CQD-VCSEL: Testing for Spatial Coherence

Figure 11A:
FIG. 11 shows red CQD-VCSEL in operation without a long pass filter to show the spontaneous emission and the laser beam as well as the coaxial unabsorbed, focused pump laser beam (white spot on the screen), according to one or more embodiments. (a) Below threshold and (b) Above threshold excitation.
Figure 11B:

To further highlight the well-defined spatial coherence, FIG. 11 shows close-up photographic images in the experiment when the long pass filter was removed. The image on the target screen is a composition of the residual transmission from the excitation beam ($\lambda$=400 nm, blue, though appearing white in the pictures due to CCD saturation) and emission from CQD-VCSEL. When the pumping level is below threshold, spontaneous emission from CQD-VCSEL illuminates the target screen weakly and almost uniformly (FIG. 11a). By contrast, when pump level exceeds the threshold (FIG. 11b), a red laser beam from CQD-VCSEL emerges as a spatially well defined and centered with respect to the transmitted pumping beam.

Sub-Nanosecond Amplified Spontaneous Emission

While the use of an ultrashort (sub-picosecond) pulse laser is useful for the key research goals into the excitonic origins of RGB stimulated emission in the dense CQD films as well as demonstrating the CQD-VCSELs, such a laser source is impractical for compact device applications such as RGB projector displays. Towards this end we here briefly mention current work where a compact solid state laser (532 nm, 270 ps (FWHM) pulse width, 1 kHz repetition rate—PowerChip laser from Teem Photonics) has been employed to achieve robust ASE of our red thin solid CQD films—relying and exploiting the operation in the single exciton gain regime.

Figure 12A:
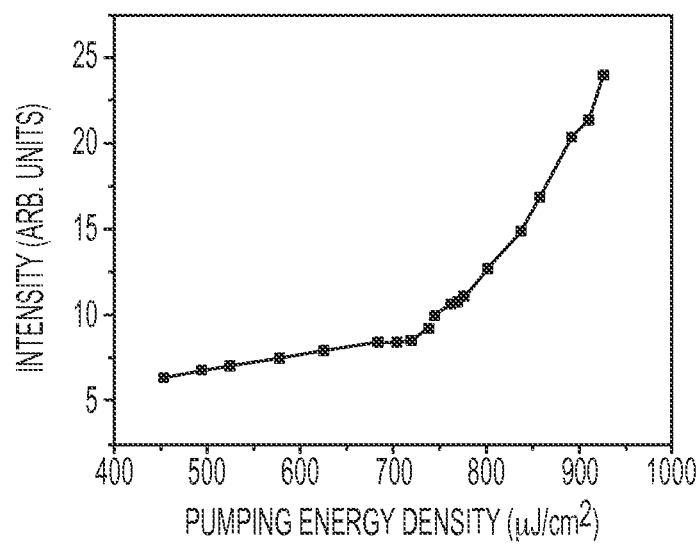
FIG. 12 shows ASE of the red CQD film pumping by a compact 1 kHz repetition rate sub-nanosecond pulsed 532 nm laser, according to one or more embodiments. (a) Intensity of edge emission as a function of pump energy density per pulse. (b) Transient ASE at two different pumping energy density, time referenced to the pumping laser.
Figure 12B:
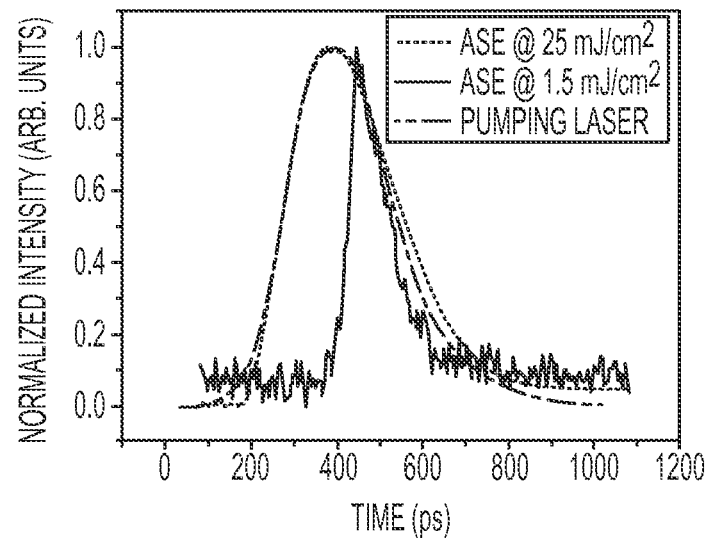

FIG. 12a shows the intensity of edge emission as a function of pump pulse energy density. The ASE occurs when the pumping is greater than 720 $\mu J/cm^2$. In contrast with ultrashort (sub-picosecond) pulsed excitation, the possible competition from the Auger decay process (for finite amount of CQDs with multiexciton state) in this "quasi-steady-state" pumping pulse could be significant. Rate equations are necessary to solve for average number of exciton per CQD: <N>. The model rate equations were also considered with the absorption of red CQD film at 532 nm (reduced from that at 400 nm by factor of 5.1), we find that at the ASE threshold (720 $\mu J/cm^2$), the average number of exciton per CQD at maximum is <N>=0.86, again in very good agreement with <N>=0.80 when using ultrashort pulse laser.

To focus on the tell-tale time dynamics, the time resolved ASE (FIG. 8b) was measured by a fast photodiode (25 GHz) and a digital sampling oscilloscope (50 GHz). The pulse width of ASE output is seen to increase with pumping level so as to finally reach the duration of the pump laser pulse width which in turn is more than twice of Auger time constant for this CQD system. This result directly shows quasi-CW ASE from red CQD film without the inhibition by the Auger process and invites further device development.

It will be appreciated that while a particular sequence of steps and materials has been shown and described for purposes of explanation, the sequence or materials may be varied in certain respects, or the steps/materials may be combined, while still obtaining the desired configuration. Additionally, modifications to the disclosed embodiment and the invention as claimed are possible and within the scope of this disclosed invention.

The invention claimed is:

1. A vertical-cavity surface-emitting laser comprising;
a resonant laser cavity; and
a dense packed thin film of colloidal quantum dots comprising hydrophobic surface ligands as a single-exciton optical gain medium positioned in the cavity,
wherein the packing density of the colloidal quantum dots in the film is between 50% and 100%.

2. The laser of claim 1 wherein the colloidal quantum dots comprise aromatic surface ligands.

3. The laser of claim 1, wherein the average number of exitons per colloidal quantum dot is in the range of 0.73 to 0.80.

4. The laser of claim 1, wherein the colloidal quantum dots have a core-shell structure comprising a core and a shell, and the core diameter is in the range of 2-10 nm.

5. The laser of claim 4, wherein the shell thickness is in the range of 1-5 nm.

6. The laser of claim 4, wherein the core-shell bandgap difference is about 1-2 eV as measured for bulk-equivalent materials.

7. The laser of claim 1, wherein the colloidal quantum dots are CdSe/ZnCdS.

8. The laser of claim 1, wherein the colloidal quantum dots are type-I quantum dots.

9. The laser of claim 1, wherein red, green, and blue wavelength lasing is enabled.

10. The laser of claim 1, wherein the film is a spin-cast self-assembled film.

11. The laser of claim 1, wherein the amplified spontaneous emission threshold of the optical gain medium is at energy densities less than 90 $\mu J/cm^2$.

12. The laser of claim 1, wherein the laser's stimulated emission time exceeds the Auger time constant of the quantum dot film.

13. The laser of claim 1, wherein the film supports more than 1 GHz frequency acoustic wave propagation.

* * * * *